US008855969B2

(12) United States Patent
Berry, Jr. et al.

(10) Patent No.: US 8,855,969 B2
(45) Date of Patent: Oct. 7, 2014

(54) FREQUENCY GUARD BAND VALIDATION OF PROCESSORS

(75) Inventors: Robert W. Berry, Jr., Round Rock, TX (US); Diyanesh B. Chinnakkonda, Bangalore (IN); Prasanna Jayaraman, Bangalore (IN); Tony E. Sawan, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 547 days.

(21) Appl. No.: 13/170,150

(22) Filed: Jun. 27, 2011

(65) Prior Publication Data
US 2012/0330616 A1 Dec. 27, 2012

(51) Int. Cl.
*G01R 31/28* (2006.01)
*G06F 11/24* (2006.01)

(52) U.S. Cl.
CPC ............ *G06F 11/24* (2013.01); *G01R 31/2879* (2013.01)
USPC ........................................................ 702/186

(58) Field of Classification Search
CPC ........................ G06F 11/3409; Y02B 60/1217
USPC ........................................................ 702/186
See application file for complete search history.

(56) References Cited

U.S. PATENT DOCUMENTS

| 6,792,379 | B2 | 9/2004 | Ando |
| 6,983,234 | B1 * | 1/2006 | Hangal et al. .................. 703/14 |
| 7,194,645 | B2 | 3/2007 | Bieswanger et al. |
| 7,228,242 | B2 | 6/2007 | Read et al. |
| 7,444,526 | B2 | 10/2008 | Felter et al. |
| 7,447,602 | B1 | 11/2008 | Bradley et al. |
| 7,739,573 | B2 | 6/2010 | DeMent et al. |
| 7,783,906 | B2 | 8/2010 | Turner et al. |
| 8,127,160 | B2 | 2/2012 | Bieswanger et al. |
| 2002/0066045 | A1 | 5/2002 | Layton et al. |
| 2003/0071657 | A1 | 4/2003 | Soerensen et al. |
| 2003/0120961 | A1 | 6/2003 | Cooper |
| 2004/0128567 | A1 | 7/2004 | Stewart |
| 2006/0156040 | A1 | 7/2006 | Naveh et al. |
| 2006/0190745 | A1 | 8/2006 | Matsushima et al. |
| 2007/0050650 | A1 | 3/2007 | Conroy et al. |
| 2007/0052453 | A1 | 3/2007 | Wald |

(Continued)

OTHER PUBLICATIONS

U.S. Appl. No. 13/340,640, filed Dec. 29, 2011, Chase, Harold W., et al.

(Continued)

*Primary Examiner* — Jonathan C Teixeira Moffat
*Assistant Examiner* — Joseph J Yamamoto
(74) *Attorney, Agent, or Firm* — DeLizio Gilliam, PLLC

(57) ABSTRACT

Whether validation of at least one of a plurality of previously validated processors on a first system produced data usable for computing a validation start frequency of an unvalidated processor on a second system is determined. If validation of at least one of the plurality of previously validated processors on the first system produced data usable for validating the unvalidated processor, a validation start frequency associated with the unvalidated processor can be computed based, at least in part, on system parametric data associated with a subset of the plurality of previously validated processors that were validated on the first system. Otherwise, the validation start frequency associated with the unvalidated processor is computed based, at least in part, on tester parametric data associated with the unvalidated processor. Validation of the guard band frequency for the unvalidated processor is initiated at the validation start frequency.

20 Claims, 6 Drawing Sheets

(56) References Cited

U.S. PATENT DOCUMENTS

| | | |
|---|---|---|
| 2007/0245161 A1 | 10/2007 | Shaw et al. |
| 2009/0037712 A1 | 2/2009 | Mallik et al. |
| 2009/0049220 A1 | 2/2009 | Conti et al. |
| 2009/0049314 A1 | 2/2009 | Taha et al. |
| 2009/0144568 A1 | 6/2009 | Fung |
| 2009/0157936 A1 | 6/2009 | Goss et al. |
| 2009/0177422 A1 | 7/2009 | Cox et al. |
| 2009/0177903 A1 | 7/2009 | Rozen et al. |
| 2009/0199019 A1 | 8/2009 | Hongisto et al. |
| 2010/0094572 A1* | 4/2010 | Chase et al. ............. 702/57 |
| 2010/0095137 A1 | 4/2010 | Bieswanger et al. |
| 2010/0125436 A1 | 5/2010 | Chase et al. |
| 2012/0054515 A1 | 3/2012 | Naffziger et al. |
| 2012/0198255 A1 | 8/2012 | Chase et al. |

OTHER PUBLICATIONS

"U.S. Appl. No. 13/340,640 Office Action", Jul. 20, 2012, 12 pages.
"U.S. Appl. No. 13/340,640 Office Action", Feb. 28, 2013, 6 pages.
Bose, Pradip et al., "Power-Efficient. Reliable Microprocessor Architectures: Modeling and Design Methods", May 2010, pp. 299-304.
Hanumaiah, Vinay et al., "Maximizing Performance of Thermally Constrained Multi-core Processors by Dynamic Voltage and Frequency Control", Nov. 2009, pp. 310-313.
Monticelli, Dennis M., "Taking a System Approach to Energy Management", Sep. 16-18, 2003, 5 pages.
"U.S. Appl. No. 12/251,891 Office Action", Jun. 30, 2011, 19 pages.

* cited by examiner

FREQUENCY GUARD BAND VALIDATION OF PROCESSORS

BACKGROUND

Embodiments of the inventive subject matter generally relate to the field of system validation and, more particularly, to validating frequency guard bands associated with processors.

A processor is generally associated with a nominal or typical operating condition (e.g., a nominal operating frequency) at which the processor is designed to operate. However, in a practical real-world environment (i.e., when the processor is deployed in a system), changes in environmental conditions (e.g., ambient temperature), aging, system glitches, load and line variations, and other such transients can result in a deviation from the nominal operating condition. For example, the operating frequency of the processor may deviate from the nominal operating frequency if the workload being executed by the processor increases. A frequency guard band associated with the processor is the amount (or uncertainty margin) by which the operating frequency of the processor can deviate from the nominal operating frequency, while reliably achieving desired performance levels.

SUMMARY

Various embodiments of a mechanism for frequency guard band validation of processors are disclosed. In one embodiment, a method comprises determining whether at least one of a plurality of previously validated processors was validated on a first system having a substantially similar configuration as a second system in which an unvalidated processor is being tested. If at least one of the plurality of previously validated processors was validated on the first system having the substantially similar configuration as the second system, a subset of the plurality of previously validated processors that were validated on the first system is identified. A validation start frequency associated with the unvalidated processor is computed based, at least in part, on system parametric data associated with the subset of the plurality of previously validated processors that were validated on the first system. The validation start frequency indicates an operating frequency associated with the unvalidated processor at which to initiate validation of a guard band frequency for the unvalidated processor. The system parametric data associated with the subset of the plurality of previously validated processors comprises operating parameters associated with each of the subset of the plurality of previously validated processors when the processor is coupled with the first system. If none of the plurality of previously validated processors were validated on the first system having the configuration substantially similar to the second system, the validation start frequency associated with the unvalidated processor is computed based, at least in part, on tester parametric data associated with the unvalidated processor. The tester parametric data associated with the unvalidated processor comprises nominal operating parameters associated with the unvalidated processor when the unvalidated processor is not coupled with the second system. Validation of the guard band frequency for the unvalidated processor is initiated at the validation start frequency.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

Figure 1:
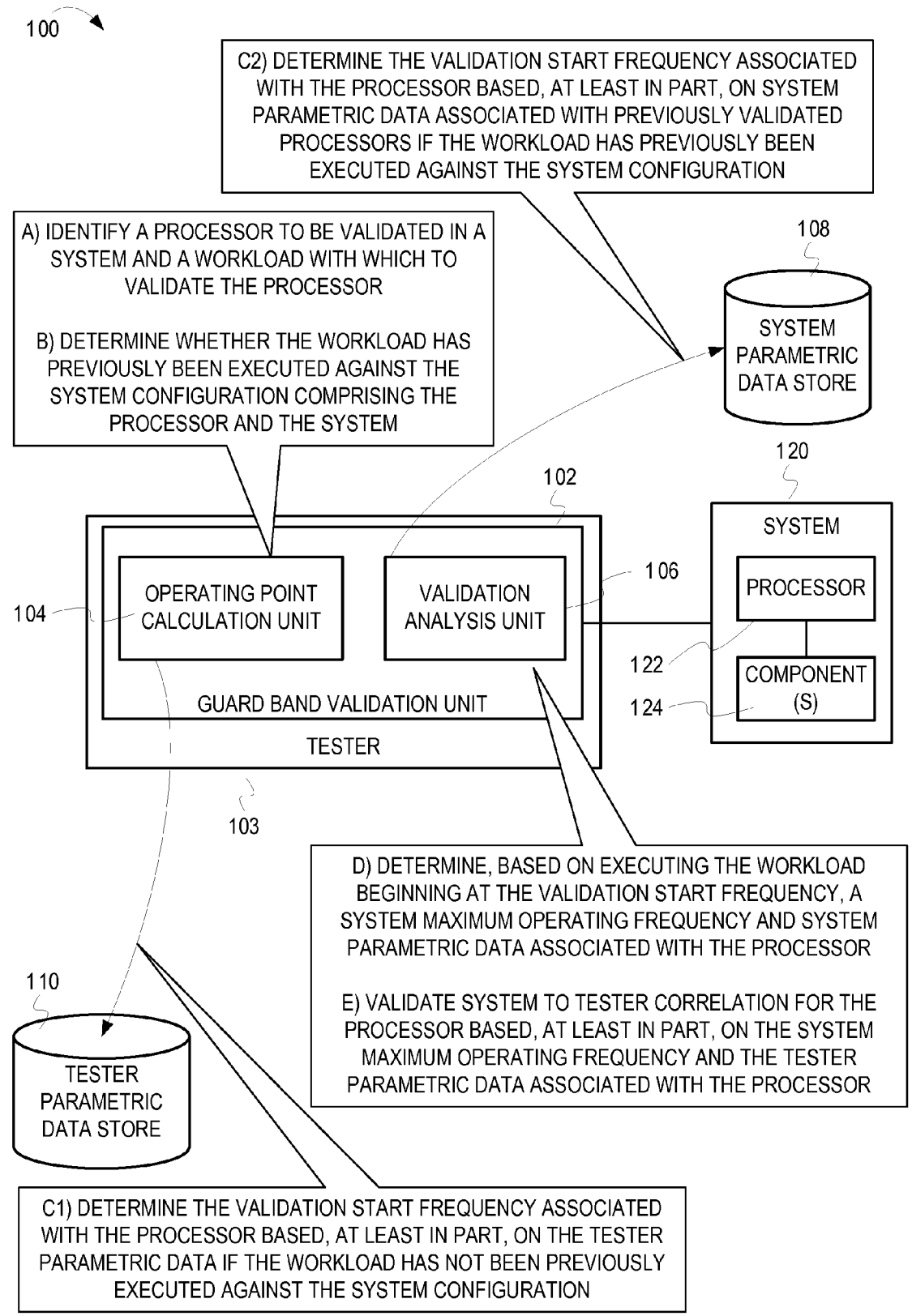
FIG. 1 is a block diagram illustrating an example mechanism for validating frequency guard bands associated with processors.

The description that follows includes example systems, methods, techniques, instruction sequences and computer program products that embody techniques of the present inventive subject matter. However, it is understood that the described embodiments may be practiced without these specific details. For instance, although examples refer to techniques for validating frequency guard bands associated with processors, embodiments are not so limited. In other embodiments, the techniques described herein can be extended for validating guard bands associated with other operating parameters (e.g., operating voltage) and/or for validating guard bands associated with other suitable components (e.g., application specific integrated circuits (ASICs)). In other instances, well-known instruction instances, protocols, structures and techniques have not been shown in detail in order not to obfuscate the description.

Existing procedures for determining frequency guard bands ("frequency guard banding procedures") associated with the processor typically begin at a nominal operating frequency associated with the processor. Starting at the nominal operating frequency, the existing frequency guard banding procedures either execute a binary search algorithm or sequentially increment the operating frequency of the processor to determine the maximum operating frequency before which system failure is detected. For example, starting at the nominal operating frequency, the processor may be configured to execute one or more workloads (e.g., an application, a set of instructions, etc.). The operating frequency of the processor may be incremented (with the operating voltage held constant) for a specific period of runtime, until a system comprising the processor hits a critical path failure. However, the existing frequency guard banding procedures may be expensive, time-consuming, and computationally intensive. The time associated with executing the frequency guard banding procedures can also constitute a large portion of the overall validation cycle and can increase the overall validation cycle time.

Guard banding procedures start at a given frequency ("validation start frequency"). Using a validation start frequency that is higher than the nominal operating frequency, and closer to the desired guard band frequency and/or the maximum operating frequency can reduce the validation time associated with frequency guard banding of an unvalidated processor. The validation start frequency associated with the unvalidated processor can be determined, at least in part, by correlating parametric data (e.g., operating voltage, current, and temperature) of the unvalidated processor with parametric data of one or more previously validated processors. The validation start frequency associated with the processor may also be determined based, at least in part, on leveraging tester data (e.g., nominal operating voltage, current, and temperature) determined for the unvalidated processor in a standalone test environment. Since it can be presumed that a processor operates reliably at lower operating frequencies, a validation start frequency can be predicted that is closer to the desired guard band frequency and/or the maximum operating frequency. Predicting a validation start frequency that is closer to the desired guard band frequency and/or the maximum operating frequency allows testing of the unvalidated processor at lower operating frequencies to be avoided. Avoiding testing the lower operating frequencies reduces the overall number of frequencies at which the processors are tested. In system validation environments where the frequency guard bands associated with all (or at least a large sampling) of the processors are validated, reducing the number of frequencies at which the processors are tested can reduce the number of operations executed (for frequency guard band validation) per processor and can result in a shorter cycle time. Consequently, the mechanism described herein for frequency guard banding in a system test environment can reduce the time required to identify voltage and frequency characteristics associated with the processor, can significantly reduce the overall validation cycle time, and can result in quicker system-tester correlation of the processor.

FIG. 1 is a block diagram illustrating an example mechanism for validating frequency guard bands associated with processors. FIG. 1 depicts a frequency guard band validation system 100 including a tester 103, a guard band validation unit 102, a system parametric data store 108, and a tester parametric data store 110. The guard band validation unit 102 comprises an operating point calculation unit 104 coupled with a validation analysis unit 106. In the system test environment, a processor 122 is connected to (or plugged into) the system 120 (e.g., a circuit board) that comprises one or more other components 124 (e.g., memory controller, co-processor, application specific integrated circuits, etc.) in addition to the processor. Operating parameters (or parametric data) associated with the processor 122 in the system test environment is herein referred to as "system parametric data." In other words, the system parametric data can comprise operating parameters associated with the processor 122, when the processor 122 is tested as part of the system 120 that comprises one or more other components 124. The system parametric data can take into consideration the interactions between the processor 122 and other components 124 of the system, the impact of the other components 124 of the system on the processor 122, and other such factors. The system parametric data can comprise operating voltage, current, operating temperature, maximum operating frequency, type of workload (e.g., a workload identifier or name), and other suitable parameters associated with the processor 122. The system parametric data may vary depending on the type of workload being executed by the processor 122 and the operating mode in which the processor 122 is configured. In FIG. 1, the system parametric data store 108 comprises the system parametric data associated with one or more processors that were previously validated. The system parametric data store 108 can also comprise an indication of a system configuration associated with the system 120 on which the processors were previously validated, workload(s) that was executed by the previously validated processors to generate the system parametric data, and operating mode(s) in which the previously validated processors were configured.

However, in a standalone test environment, the processor 122 may not be connected to other components. Instead, the processor 122 may be tested as a standalone component. The parametric data associated with the processor 122 in the standalone test environment is herein referred to as "tester parametric data." The tester parametric data may not reflect the impact of the other components on the processor 122. The tester parametric data can comprise the nominal operating voltage, nominal current, nominal temperature, nominal operating frequency, and other operating parameters associated with the processor 122 when the processor 122 is tested as a standalone unit in the standalone test environment. In some implementations, the tester parametric data may be stored as part of the processor 122 (e.g., on read only memory (ROM), erasable programmable ROM (EPROM), etc.). In some implementations, frequency guard bands associated with the processor 122 may also be determined in the standalone test environment ("target frequency guard bands"), when the processor 122 is tested as a standalone unit. The target frequency guard bands associated with the processor 122 may also be stored in the tester parametric data store 110. As will be further described below, frequency guard banding procedures can be executed when the processor 122 is connected to the system 120 to validate the frequency guard bands in the system test environment against the frequency guard bands in the standalone test environment. As will be subsequently described in stages A-E, the guard band validation unit 102 can determine validation start frequency. The validation start frequency can be determined based, at least in part, on the system parametric data and/or the tester parametric data to minimize system validation time.

At stage A, the operating point calculation unit 104 identifies the processor 122 to be validated in the system 120 and a workload (e.g., an application, an executable, a set of instructions, etc.) with which to validate the processor. In response to detecting the processor (e.g., after the processor 122 is plugged into or connected to the system 120), the operating point calculation unit 104 can determine a system configuration associated with the system 120. The system configuration can include a type of processor 122 (e.g., a processor configuration), one or more other components 124 that constitute the system 120, interconnections amongst the components of the system, interconnections between the processor 122 and the components 124 of the system, etc. The operating point calculation unit 104 can also determine a workload that is to be executed by the processor 122. The operating point calculation unit 104 can upload the workload into a memory unit associated with the processor 122 (e.g., processor cache memory, external memory unit coupled with the processor, etc.) for subsequent execution by the processor 122. The operating point calculation unit 104 can also determine an operating mode in which the processor 122 should be configured for frequency guard band validation. In some implementations, the operating point calculation unit 104 (or a server) can cause the processor 122 to switch to the appropriate operating mode. In other implementations, a human operator (e.g., an administrator or user) can configure the processor 122 in the appropriate operating mode and the operating point calculation unit 104 can detect and record the operating mode in which the processor 122 is configured.

At stage B, the operating point calculation unit 104 determines whether the workload has previously been executed against the system configuration. The operating point calculation unit 104 can determine whether one or more other processors have been previously tested on the system 120 with the same system configuration. The operating point calculation unit 104 may also determine whether the one or more other processors (that were validated on the system 120 with the same system configuration) executed the same workload and were configured in the same operating mode as the processor 122. If the operating point calculation unit 104 determines that one or more other processors were previously tested on the system 120 with the same system configuration and with the same workload, and determines that the one or more other processors were configured in the same operating mode, then system parametric data associated with the previously tested processors can be leveraged to predict the validation start frequency associated with the processor 122, as will be further described below in stage C2. Otherwise, the validation start frequency associated with the processor 122 can be estimated based, at least in part, on the tester parametric data, as will be further described below in stage C1.

Figure 2:
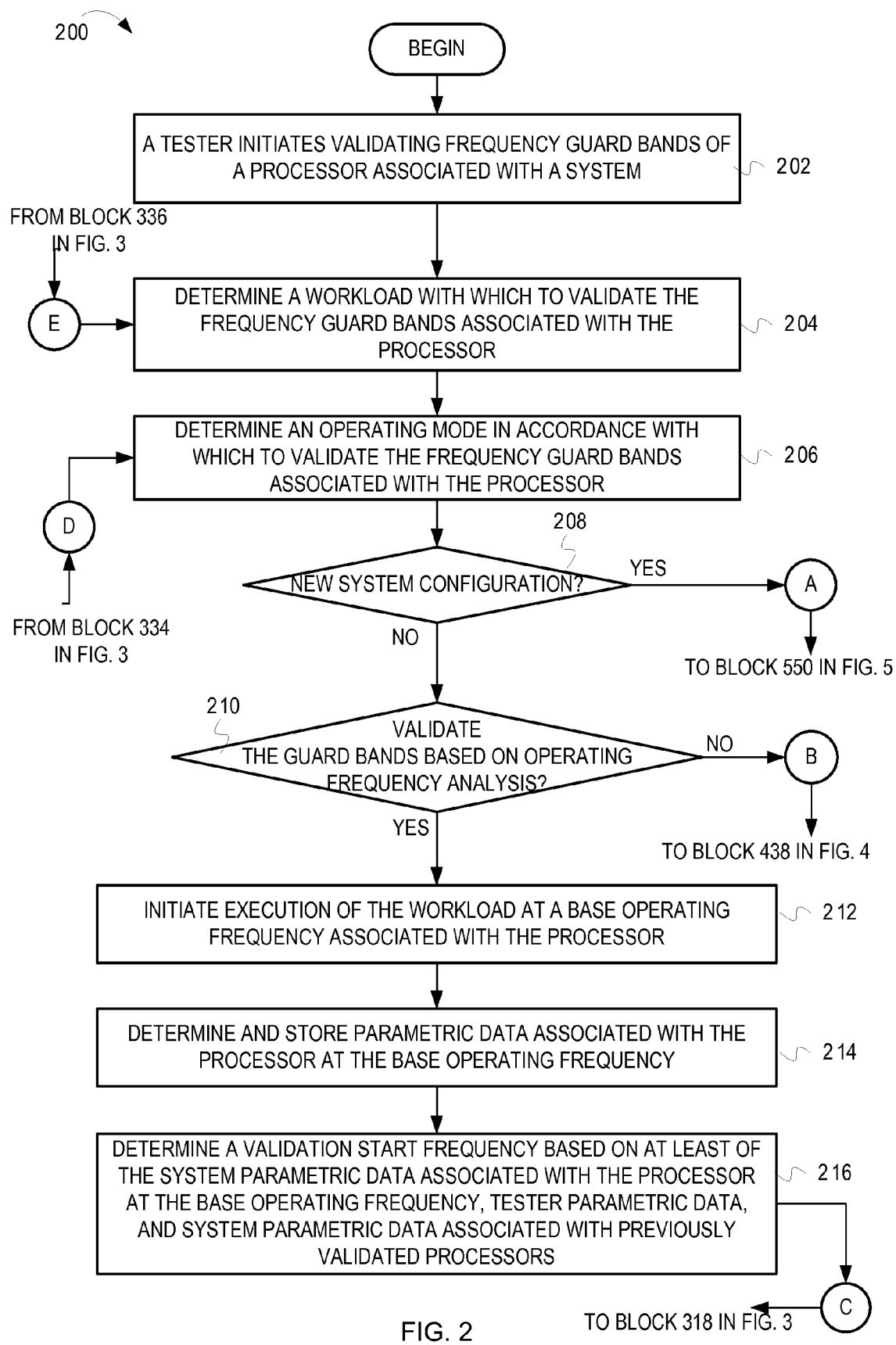
FIG. 2 is a flow diagram illustrating example operations for validating frequency guard bands associated with processors.

At stage C1, the operating point calculation unit 104 determines the validation start frequency associated with the processor 122 based, at least in part, on the tester parametric data if the workload has not been previously executed against the system configuration. In one implementation, as will be described in FIGS. 2 and 3, the operating point calculation unit 104 can execute an operating frequency analysis mechanism to estimate the validation start frequency associated with the processor 122. The operating point calculation unit 104 can cause the processor 122 to execute the workload at the nominal operating frequency and can determine system parametric data associated with the processor 122 at the nominal operating frequency. The operating point calculation unit 104 can determine the validation start frequency based on the system parametric data associated with the processor 122 at the nominal operating frequency, trends in system parametric data associated with one or more previously validated processors, tester parametric data (e.g., the maximum operating frequency determined for the processor 122 in the standalone test environment, the temperature at which the processor 122 was tested in the standalone test environment, etc.), and/or system parametric data generated by the processor 122 for a different workload/operating mode.

Figure 3:
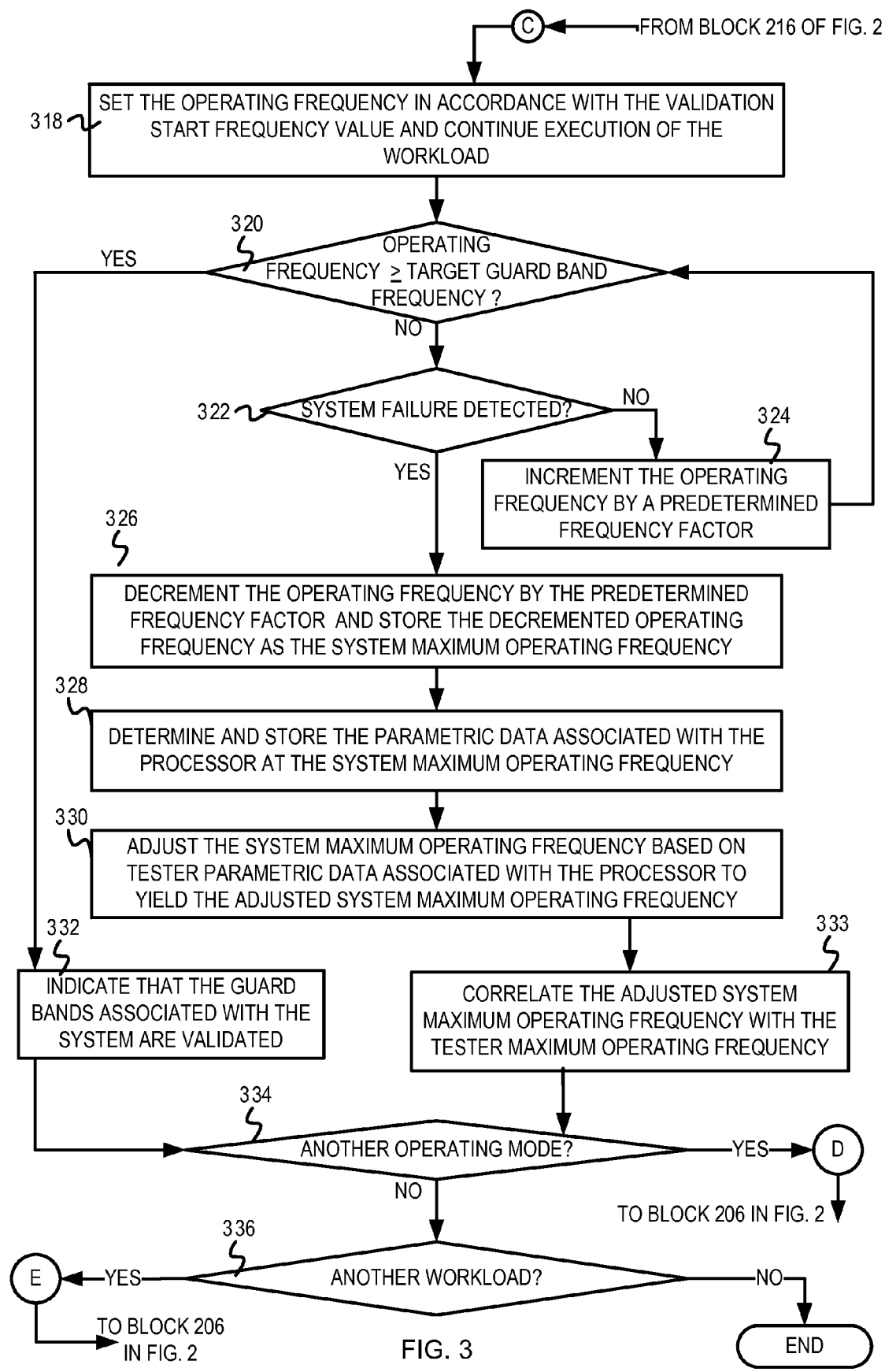
FIG. 3, FIG. 4, and FIG. 5 are continuations of FIG. 2 and illustrate example operations for validating frequency guard bands associated with processors.

In another implementation, as will be described in FIGS. 3 and 4, the operating point calculation unit 104 can employ an operating voltage analysis mechanism to estimate the validation start frequency associated with the processor 122. The operating point calculation unit 104 can cause the processor 122 to execute the workload at a suitable base operating voltage and a base operating frequency. Maintaining a constant base operating frequency, the operating point calculation unit 104 can decrease the operating voltage as the processor 122 continues to execute the workload. The operating point calculation unit 104 can determine the lowest voltage at which the processor 122 can operate without system failure ("minimum operating voltage"). The operating point calculation unit 104 can determine the validation start frequency based, at least in part, on the difference between the base operating voltage and the minimum operating voltage and on the relationship between operating voltage and operating frequency. Additionally, the operating point calculation unit 104 can also leverage the system parametric data and the tester parametric data to determine the validation start frequency.

The operations described in stage C1 can be employed to determine the validation start frequency when the processor 122 is configured in any suitable operating mode (e.g., a normal operating mode, a power optimized operating mode, a speed optimized operating mode, etc.). The validation start frequency for the processor 122 configured in one operating mode (e.g., the speed optimized operating mode) can also be determined based on the nominal operating frequency associated with a previously validated operating mode (e.g., the normal operating mode), the system parametric data associated with the processor configured in the previously validated operating mode, and/or other voltage-frequency trends.

At stage D, the validation analysis unit 106 determines, based on executing the workload at the validation start frequency, a system maximum operating frequency and parametric data associated with the processor 122. The validation analysis unit 106 can cause the processor 122 to initiate execution of the workload at the validation start frequency. The validation analysis unit 106 can increment (at regular intervals) the operating frequency of the processor 122 and can determine whether the increase in operating frequency resulted in system failure. For example, beginning at the validation start frequency, the validation analysis unit 106 can increment the operating frequency of the processor 122 by 1% of the validation start frequency at each iteration. In some implementations, the validation analysis unit 106 can determine the highest frequency at which the processor 122 (when connected in the system 120) can operate before system failure. This highest operating frequency is herein referred to as "system maximum operating frequency." Additionally, the validation analysis unit 106 can also determine the system parametric data including the operating voltage, current, and temperature generated by the processor 122 at the system maximum operating frequency. The validation analysis unit 106 can store an indication of the system maximum operating frequency and the system parametric data at the system maximum operating frequency in the system parametric data store 108.

At stage E, the validation analysis unit 106 validates system to tester correlation for the processor 122 based, at least in part, on the system maximum operating frequency value and the system parametric data. As will be further described in FIG. 3, the validation analysis unit 106 can adjust the system maximum operating frequency based, at least in part, on tester parametric data to determine the adjusted system maximum operating frequency. For example, the validation analysis unit 106 can determine the adjusted system maximum operating frequency based, at least in part, on knowledge of the operating voltage and temperature at which the tester maximum operating frequency associated with the processor 122 was determined in the standalone test environment. The validation analysis unit 106 can compare the system adjusted maximum operating frequency against the tester maximum operating frequency. If there is a high correlation between the adjusted system maximum operating frequency and the tester maximum operating frequency, the operation of the processor 122 in the system test environment may be deemed to be validated against the operation of the processor 122 in the standalone test environment. Otherwise, the system 120 and the processor 122 can be further analyzed to ascertain the cause for deviation in the system parametric data from the tester parametric data.

As described above in stage C1, the validation start frequency associated with the processor 122 can be determined based, at least in part, on the tester parametric data if it is determined that the workload was not previously executed against the system configuration. However, if it is determined that workload was previously executed against the system configuration, various other data (e.g., system parametric data associated with previously validated processors) can be leveraged to determine the validation start frequency associated with the processor 122, as will be described below in stage C2.

At stage C2, the operating point calculation unit 104 determines the validation start frequency associated with the processor 122 based, at least in part, on the system parametric data associated with previously validated processors with the same workload and system configuration. In one implementation, as will be described in FIG. 5, the operating point calculation unit 104 can identify one or more processors that were validated on a system with the same system configuration, that executed the same workload, and that were configured in the same operating mode as the processor 122. The operating point calculation unit 104 can estimate the system maximum operating frequency associated with the system configuration, the workload, and the operating mode based on the system parametric data generated by the one or more previously validated processors. For example, the operating point calculation unit 104 can estimate the system maximum operating frequency by calculating an average of the system maximum operating frequency associated with the one or more previously validated processors. The operating point calculation unit 104 may then determine the validation start frequency with a predetermined percentage decrement of the estimated system maximum operating frequency. The validation analysis unit 106 can then execute operations described above at stage D and stage E to determine the actual system maximum operating frequency associated with the processor 122 and the adjusted system maximum operating frequency. As described above, in stage E, the validation analysis unit 106 can also validate system to tester correlation for the processor 122.

It is noted that in some implementations, the validation analysis unit 106 may not increment the operating frequency of the processor 122 until system failure is detected. Instead, the validation analysis unit 106 may halt the frequency guard band validation procedure and may indicate that system to tester correlation has been validated when the operating frequency of the processor 122 equals or exceeds the target guard band frequency (i.e., the guard band frequency determined for the processor 122 in the standalone test environment). For example, if a frequency guard band that is 15% higher than the nominal operating frequency is desired, the validation analysis unit 106 may halt the frequency guard band validation process when the operating frequency is at least 15% higher than the nominal operating frequency.

In some embodiments, the guard band validation unit 102, the system parametric data store 108, and the tester parametric data store 110 may be implemented in a single system. In some embodiments, one or more of the guard band validation unit 102, the system parametric data store 108, and the tester parametric data store 110 may be implemented in different systems. In some embodiments, the system parametric data store 108 and the tester parametric data store 110 may be implemented on external memory units, and the guard band validation unit 102 may interface with the external memory units to access the system parametric data and the tester parametric data respectively.

FIG. 2, FIG. 3, FIG. 4, and FIG. 5 depict a flow diagram illustrating example operations for validating frequency guard bands associated with processors. Flow 200 begins at block 202 in FIG. 2.

A tester initiates validation of frequency guard bands of a processor associated with a system (block 202). As described above in FIG. 1, the processor may be connected in the system to validate the frequency guard bands in a system test environment. The system can comprise one or more other components in addition to the processor. In one implementation, the system 120 may be a circuit board (comprising one or more other components 124) that may be coupled with the guard band validation unit 102. The system 120 may comprise a slot or connection pins to facilitate connection of the processor 122 in the system 120 (and with the one or more components 124 of the system). Frequency guard band validation of the processor in the system test environment can ensure that interactions between the processor and other components are taken into consideration when determining the frequency guard bands associated with the processor. The flow continues at block 204.

A workload with which to validate the frequency guard bands associated with the processor is determined (block 204). In some implementations, the workload can be selected from a plurality of test workloads. Each of the test workloads can comprise an application, a set of instructions, a set of independent or inter-dependent requests, etc. Each of the test workloads may be associated with distinct workload characteristics and may be designed to stress various components of the system at different levels, to stress the processor at different levels, to test the interactions between the processor and the components of the system, etc. The flow continues at block 206.

An operating mode with which to validate the guard bands associated with the processor is determined (block 206). For example, the processor may be configured to operate in various operating modes such as a nominal operating mode, a power optimized operating mode, a speed optimized operating mode, etc. Each of the operating modes may be characterized by a different nominal operating frequency and nominal operating voltage. In some implementations, as part of selecting the workload and the operating mode in accordance with which to validate the frequency guard bands, the target guard band frequency, the nominal operating frequency, and/or the nominal operating voltage that corresponds to the selected workload and the selected operating mode can also be determined. The flow continues at block 208.

It is then determined whether the system comprising the processor is associated with a new system configuration (block 208). For example, the guard band validation unit 102 of FIG. 1 can determine the system configuration associated with the system comprising the processor and can determine whether another processor has been previously validated on a system with the same system configuration. The system configuration can indicate the processes, components (e.g., integrated circuits, etc.), interconnections between components, and other elements that constitute the system. The system configuration can also indicate the type of processor being validated and interconnections between the processor and the other components of the system. In addition, it may be determined whether the other processors (that were previously validated on the system with the same system configuration) executed the same workload (determined at block 204) and were configured in the same operating mode (determined at block 206). If one or more other processors were previously tested on a system with the same system configuration, executed the same workload, and were configured in the same operating mode, system parametric data associated with the previously tested processors can be leveraged to predict a validation start frequency for the processor, as will be further described below in FIG. 5. The flow continues at block 548 in FIG. 5 if it is determined that the system configuration is not new. If it is determined that the processor to be validated is associated with a new system configuration, the flow continues at block 210.

It is determined whether to validate the guard bands based on operating frequency analysis (block 210). In some implementations, whether the operating frequency analysis technique (described in FIG. 2) or the operating voltage analysis technique (described in FIG. 4) is employed for validating the frequency guard bands can depend on whether processors associated with the same system configuration, operating mode, and workload have been previously validated, the availability of system parametric data associated with the previously validated processors, etc. For example, the operating frequency analysis technique may be selected initially when little to no system parametric data is available (e.g., for frequency guard band validation associated with a first set of processors). The operating voltage analysis technique can be employed for validation of subsequent processors based on system parametric data recorded for the first set of processors (e.g., after the correlation between the voltage applied to processor and the current generated by the processor has been determined). In another implementation, whether the operating frequency analysis technique or the operating voltage analysis technique is employed for validating the frequency guard bands can depend on the operating mode in which the processor is configured (determined at block 206). For example, if the processor is configured to operate in a power save mode, the frequency guard band associated with a lowest operating voltage can be determined based on operating voltage analysis (as will be described in FIG. 4). As another example, if the processor is configured to operate in a speed optimized mode, the frequency guard band that is close to the maximum operating frequency can be determined based on operating frequency analysis (as will be described in FIG. 2). If it is determined that the frequency guard bands associated with the processor are to be validated based on operating frequency analysis, the flow continues at block 212. Otherwise, the flow continues at block 436 in FIG. 4, where the frequency guard bands associated with the processor are validated based on operating voltage analysis.

Execution of the workload is initiated at a base operating frequency associated with the processor (block 212). The flow 200 moves from block 210 to block 212 if it is determined that the frequency guard bands associated with the processor are to be validated in accordance with operating frequency analysis techniques. In some implementations, the base operating frequency may be the nominal operating frequency associated with the processor. As described above, the nominal operating frequency associated with the processor may be determined in the standalone test environment when the processor is tested as a standalone component. The nominal operating frequency associated with the processor may be determined from the tester parametric data (e.g., in the tester parametric data store 110 of FIG. 1). In other implementations, however, the base operating frequency may be determined using other suitable techniques (e.g., by incrementing the nominal operating frequency by a predetermined factor/percentage). The flow continues at block 214.

System parametric data associated with the processor at the base operating frequency is determined and stored (block 214). During execution of the workload at the base operating frequency, system parametric data associated with the processor can be monitored. The system parametric data can include an operating voltage associated with the processor, a corresponding operating current associated with the processor, power consumed by the processor, core temperature, loadline resistance from the Voltage Regulator Module (VRM) setpoint to the processor sense point, and other such parameters that define the operating state of the processor in the system test environment. The system parametric data associated with the processor at the base operating frequency can also be recorded in the system parametric data store 108. The stored system parametric data associated with the processor can be leveraged (as described below in blocks 216 in FIGS. 2 and 448 in FIG. 4) for predicting the validation start frequency for the processor under test and for subsequent processors to be tested. The flow continues at block 216.

The validation start frequency is determined based on at least one of the system parametric data associated with the processor at the base operating frequency, the tester parametric data, and system parametric data associated with previously validated processors (block 216). In some implementations, the system parametric data associated with previously validated processors can be employed to determine a trend (or distribution) in the operating voltage and operating frequency associated with the processor. This distribution can be leveraged along with the system parametric data associated with the processor (determined at block 214) to predict the validation start frequency. It is noted that the previously validated processors may or may not have been validated on a system with the same system configuration, may/may not have executed the same workload, and may/may not have been configured in the same operating mode.

In another implementation, the system parametric data associated with the previously validated processors can be combined with the tester parametric data associated with the processor to predict the validation start frequency. For example, it may be determined (e.g., based on tester parametric data associated with the processor) that the target guard band frequency (i.e., the upper limit on the frequency guard band for the processor) as determined in the standalone test environment is 10% higher than the nominal operating frequency. In other words, it may be determined that the processor with a nominal operating frequency of 4 GHz is associated with a target guard band frequency of 4.4 GHz. Based on system parametric data associated with the previously validated processors it may be also be determined that all of the previously validated processors achieved the target guard band frequency without system failure. It may be estimated that the processor will (with high probability) also achieve the target guard band frequency without system failure. Therefore, an operating frequency that is 8% higher than the nominal operating frequency (e.g., 4.32 GHz) may be selected as the validation start frequency to preclude validation at lower operating frequencies (i.e., the frequencies between 4 GHz and 4.32 GHz). As another example, by correlating the system parametric data and the tester parametric data, the validation start frequency that is close to the target guard band frequency can be selected to minimize validation time. For example, an operating frequency that is 5% below the target guard band frequency may be selected as the validation start frequency.

In another implementation, the validation start frequency can be determined based on executing the frequency guard banding operations for the processor at a different workload and/or a different operating mode. For example, it may be determined that the frequency guard bands associated with the processor were validated at a first workload and a first operating mode. The system parametric data (including the system maximum operating frequency) associated with the processor at the first workload and the first operating mode can be leveraged to determine the validation start frequency for validating the frequency guard bands associated with the processor at a second workload and/or a second operating mode. In some implementations, if the processor was sorted at different sort frequencies, system parametric data determined based on frequency guard band validation at one sort frequency can be leveraged to determine the validation start frequency for validating the guard bands associated with the same processor at a different sort frequency. For example, a processor may be sorted at two sort frequencies—4 GHz and 2 GHz. It may be determined that a 10% frequency guard band was attained for the processor at the 4 GHz sort frequency. This can serve as an indication that a 10% frequency guard band will (with high probability) be attained for the processor at the 2 GHz sort frequency without system failure. Consequently, a validation start frequency that is closer to the 10% frequency guard band can be selected. Determining a validation start frequency that is sufficiently close to the target guard band frequency can minimize the number of operations (and time) required to ensure that the processor can handle fluctuations in operating frequency when the processor operates in conjunction with other components of a system. The flow then continues at block 318 in FIG. 3.

The operating frequency of the processor is set in accordance with the validation start frequency (block 318). The flow 200 moves from block 216 in FIG. 2 to block 318 in FIG. 3 after the validation start frequency associated with the processor is determined. The flow continues at block 320.

It is determined whether the operating frequency of the processor is greater than or equal to the target guard band frequency (block 320). As described above, in one implementation, the target guard band frequency can be the upper limit on the frequency guard bands associated with the processor. The target guard band frequency may be determined when the processor is tested as a standalone component in a standalone test environment. In some implementations, the target guard band frequency may be a predetermined percentage increment of the nominal operating frequency. For example, the target guard band frequency may be determined to be 10% higher than the nominal operating frequency. Thus, the target guard band frequency may be 3.3 GHz (e.g., 3 GHz+10%*3 GHz) for a processor with a 3 GHz nominal operating frequency. The predetermined percentage increment may be determined based, in part, on knowledge of fluctuations in the environment in which the processor will be deployed, reliability and uncertainty constraints imposed on the processor, knowledge of the maximum workload that will be executed by the processor, effects of other electronic components on the processor, etc. In some implementations, the target guard band frequency may be less than the maximum operating frequency associated with the processor while, in other implementations, the target guard band frequency may be equal to the maximum operating frequency. In some embodiments, the target guard band frequency can be determined using other suitable techniques to ensure that the processor can sustain an operating frequency that is higher than the nominal operating frequency without system failure. As will be described below, the range of frequencies between the validation start frequency and the target guard band frequency can be analyzed to ensure that the processor can operate in the system test environment without system failure or, in other words, to validate the frequency guard band associated with the processor. If it is determined that the operating frequency of the processor is greater than or equal to the target guard band frequency, frequency guard band validation is deemed to be complete and the flow continues at block 332. If it is determined that the operating frequency of the processor is less than the target guard band frequency, the flow continues at block 322.

The frequency guard bands associated with the processor are deemed to be validated (block 332). The flow 200 moves from block 320 in FIG. 3 to block 332 if it is determined that the operating frequency of the processor is greater than or equal to the target guard band frequency. The operating frequency of the processor being greater than or equal to the target guard band frequency can indicate that the processor can achieve the target guard band frequency (determined in the standalone test environment) when the processor operates in the system test environment, is configured in different operating modes, and/or executes different workloads. The operating frequency of the processor being greater than or equal to the target guard band frequency can indicate a high correlation between the system parametric data and the tester parametric data. In some implementations, as depicted in FIG. 3, the processor need not be analyzed under subsequent operating frequencies (i.e., those greater than the target guard band frequency. The flow continues at block 334.

It is determined whether failure of the system comprising the processor was detected (block 322). The flow 200 moves from block 320 in FIG. 3 to block 322 if it is determined that operating frequency of the processor is less than the target guard band frequency. In some implementations, the processor (and consequently the system) can fail (or cease operation) if the processor's operating frequency exceeds the maximum operating frequency associated with the processor. If it is determined that system failure was detected, the flow continues at block 326. Otherwise, the flow continues at block 324.

The operating frequency is incremented by a predetermined frequency factor (block 324). The flow 200 moves from block 322 to block 324 if it is determined that failure of the system comprising the processor was not detected. In one implementation, the predetermined frequency factor can be expressed as a percentage of the nominal operating frequency (e.g., the predetermined frequency factor may be 1% of the nominal operating frequency). In another implementation, the predetermined frequency factor can be a static frequency value (e.g., the predetermined frequency factor may be 1 MHz). The predetermined frequency factor can be selected to achieve an optimal balance between the smallest increment by which the operating frequency should be incremented for frequency guard band validation and the total validation time. After the operating frequency of the processor is incremented by the predetermined frequency factor, the flow loops back to block 320. The loop comprising the operations of blocks 320, 322, and 324 continues to execute until the operating frequency reaches the target guard band frequency or until system failure is detected.

The operating frequency is decremented by the predetermined frequency factor and this value is stored as the system maximum operating frequency (block 326). The flow 200 moves from block 322 to block 326 if it is determined that system failure was detected. On detecting the system failure, execution of the workload is halted and the operating frequency is decremented by the predetermined frequency factor. This value of the operating frequency represents the highest frequency at which the processor can operate without causing system failure. The highest frequency at which the processor can operate in the system test environment before system failure can be designated as the system maximum operating frequency associated with the processor. The flow continues at block 328.

Parametric data associated with the processor at the system maximum operating frequency is stored (block 328). For example, the operating voltage, current, temperature, load-line resistance, and other parameters that define the state of the processor in the system at the system maximum operating frequency can be determined. The system parametric data associated with the processor can then be stored (e.g., in the system parametric data store 108) along with an indication of the system maximum operating frequency. The flow continues at block 330.

The system maximum operating frequency is adjusted based on tester parametric data associated with the processor to yield the adjusted system maximum operating frequency (block 330). Typically, the system maximum operating frequency associated with the processor, the workload, and the operating mode in the system test environment may differ from the tester maximum operating frequency associated with the processor in the standalone test environment. This is because the workloads executed and operating conditions encountered in the standalone test environment may be different from the workloads executed and operating conditions encountered in the system test environment. To correlate the system maximum operating frequency with the tester maximum operating frequency, the system maximum operating frequency can be adjusted in accordance with the tester parametric data and the system parametric data at the system maximum operating frequency to yield the adjusted maximum operating frequency. For example, the adjusted system maximum operating frequency can be calculated based, at least in part, on knowledge of the operating voltage and temperature at which the tester maximum operating frequency was determined in the standalone test environment and on knowledge of the voltage and temperature at the system maximum operating frequency determined at block 328. As will be described below, the adjusted maximum operating frequency can then be used to verify system to tester correlation. The flow continues at block 333.

The adjusted system maximum operating frequency is correlated with the tester maximum operating frequency (block 333). Typically, because of differences in manufacturing technology and circuit sensitivity, processors with same system configuration, executing the same workload, and configured in the same operating mode can have slightly different system maximum operating frequencies. Determining the system adjusted maximum operating frequency (as described above in block 332) based, at least in part, on the tester parametric data can minimize these discrepancies. As part of correlating the adjusted system maximum operating frequency with the tester maximum operating frequency, the adjusted system maximum operating frequency can be compared against the tester maximum operating frequency. If the adjusted system maximum operating frequency associated with the processor in the system test environment is in accordance with the tester maximum operating frequency associated with the processor (e.g., if there is a strong correlation between the adjusted system maximum operating frequency and the tester maximum operating frequency), the frequency guard bands associated with the processor are deemed to be validated and system to tester correlation is deemed to be validated. In other words, if the adjusted system maximum operating frequency and the tester maximum operating frequency are equal (or differ by a predetermined value/percentage), the frequency guard bands associated with the processor are deemed to be validated and system to tester correlation is deemed to be validated. However, if the adjusted system maximum operating frequency is not in accordance with the tester maximum operating frequency, the system and the processor can be further analyzed to ascertain the cause for deviation in the system parametric data from the tester parametric data. The flow continues at block 334.

It is determined whether to validate the processor in accordance with another operating mode (block 334). The flow 200 moves from block 330 to block 334 after system failure is detected and the adjusted system maximum operating frequency associated with the processor is determined. The flow 200 also moves from block 320 to block 334 if the operating frequency is greater than or equal to the target guard band frequency. If it is determined that the processor should be validated in accordance with another operating mode in the system test environment, the flow loops back to block 206 in FIG. 2, where the next operating mode and the corresponding target guard band frequency, nominal operating frequency, and/or nominal operating voltage (e.g., for the voltage guard band analysis method) associated with the operating mode are identified. If it is determined that the processor need not be validated in accordance with another operating mode, the flow continues at block 336.

It is determined whether to validate the processor in accordance with another workload (block 336). The flow 200 moves from block 334 to block 336 if it is determined that the processor should not be validated in accordance with another operating mode. If it is determined that the processor in the system test environment should be validated in accordance with another workload, the flow loops back to block 204 in FIG. 2, where the next workload is identified and loaded into memory associated with the processor for execution by the processor. If it is determined that the processor need not be validated in accordance with another workload, the flow ends.

Figure 4:
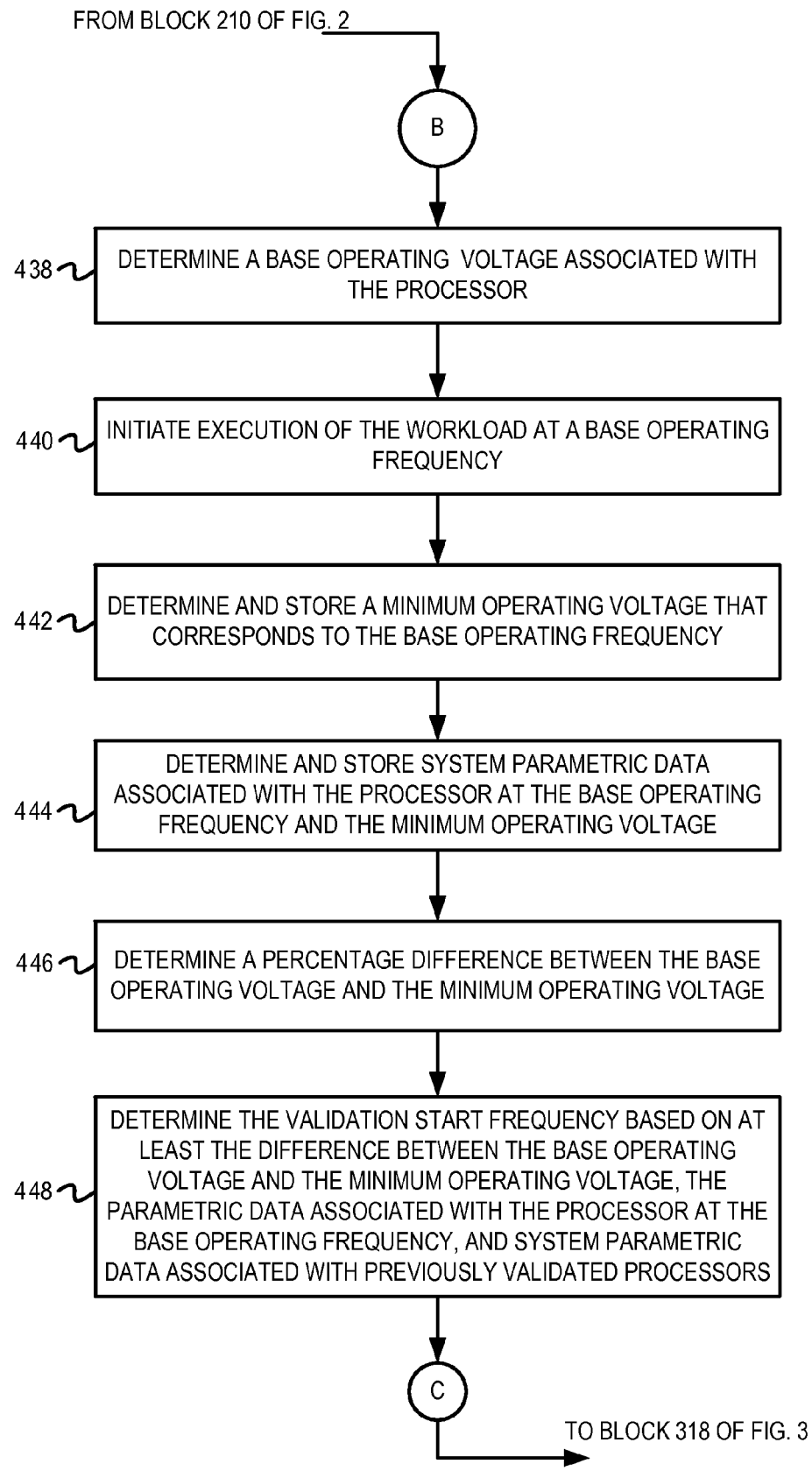

Referring now to FIG. 4, a base operating voltage associated with the system is determined (block 438). The flow 200 moves from block 210 in FIG. 2 to block 438 in FIG. 4 if it determined that the frequency guard bands associated with the processor are to be validated in accordance with operating voltage analysis techniques. In one implementation, the nominal operating voltage associated with the processor may be designated as the base operating voltage. In another implementation, the base operating voltage may be determined based, at least in part, on system parametric data generated by one or more previously validated processors. For example, the base operating voltage can be determined based on knowledge of the minimum operating voltage associated with previously tested processors. In other implementations, however, the base operating voltage may be determined using other suitable techniques (e.g., by decrementing the nominal operating voltage by a predetermined factor/percentage). The flow continues at block 440.

Execution of the workload is initiated at a base operating frequency (block 440). In one implementation, the nominal operating frequency may be designated as the base operating frequency. In another implementation, the base operating frequency may be calculated as a sum of the nominal operating frequency and a predetermined percentage (e.g., 5%) of the nominal operating frequency. In another implementation, the base operating frequency can be calculated based, at least in part, on the base operating voltage and on knowledge of the relationship between operating frequency and operating voltage. In another implementation, the base operating frequency may be determined in accordance with the tester parametric data (e.g., accessed from the tester parametric data store 110), the base operating voltage (determined at block 438), the workload being executed, and/or the operating mode in which the processor is configured. In other implementations, the base operating frequency may be any suitable operating frequency that is less than the maximum operating frequency associated with the processor. The flow continues at block 442.

A minimum operating voltage that corresponds to the base operating frequency is determined (block 442). As described above, the operating voltage of the processor is set to the base operating voltage (determined at block 438) and the operating frequency of the processor is fixed at the base operating frequency (determined at block 440). After the processor begins execution of the workload, the operating voltage of the processor can be progressively decreased by a predetermined voltage factor until system failure is detected. After system failure, the last voltage level (i.e., the lowest voltage) at which the processor can operate without system failure is determined. This voltage can be designated as the minimum operating voltage that corresponds to the base operating frequency. The flow continues at block 444.

System parametric data associated with the processor at the base operating frequency and the minimum operating voltage is determined and stored (block 444). For example, operating current, temperature, loadline resistance, and other parameters that define the state of the processor in the system at the base operating frequency and the minimum operating voltage can be determined. The system parametric data can then be stored (e.g., in the system parametric data store 108). The stored system parametric data associated with the processor can be leveraged (as described in blocks 216 in FIGS. 2 and 448 in FIG. 4) for predicting the validation start frequency for the processor under test and for subsequent processors to be tested. The flow continues at block 446.

A percentage difference between the base operating voltage and the minimum operating voltage is determined (block 446). The minimum operating voltage can be subtracted from the base operating voltage and the difference can be expressed as a percentage of the base operating voltage. For example, the base operating voltage of 1.1V may be selected at block 438. As described above, the base operating voltage may be progressively decreased while executing the workload and system failure may be detected when the operating voltage (i.e., the minimum operating voltage) is 0.9V. Accordingly, it may be determined that the difference between the minimum operating voltage and the base operating voltage is 18% of the base operating voltage. This percentage difference in operating voltage can be employed to estimate the validation start frequency as will further be described below. The flow continues at block 448.

The validation start frequency is determined based on at least the difference between the base operating voltage and the minimum operating voltage, the system parametric data associated with the processor at the base operating frequency, and system parametric data associated with previously validated processors (block 448). With reference to the above example, it was determined that the difference between the minimum operating voltage and the base operating voltage is 18% of the base operating voltage. Based on knowledge of the relationship between operating voltage and operating frequency, it may be determined that the difference between the base operating frequency and the maximum operating frequency is 18% of the base operating frequency. If the target guard band frequency is determined to be 10% of the base operating frequency, it can be estimated that the target guard band frequency will be achieved before system failure is detected. Thus, the validation start frequency can be selected at 8% of the base operating frequency to reduce validation time by not analyzing lower operating frequencies. In some implementations, as described above in block 216 of FIG. 2, system parametric data associated with one or more previously validated processors can be leveraged to determine trends in the operating voltage and the operating frequency and to accordingly select the validation start frequency. In some implementations, the tester parametric data associated with the processor can also be used to determine the validation start frequency. The flow continues at block 318 in FIG. 3, where the processor is then prompted to execute the workload and the operating frequency associated with the processor is increased from the validation start frequency until system failure occurs or the target guard band frequency is achieved, as described above in blocks 318-336.

Figure 5:
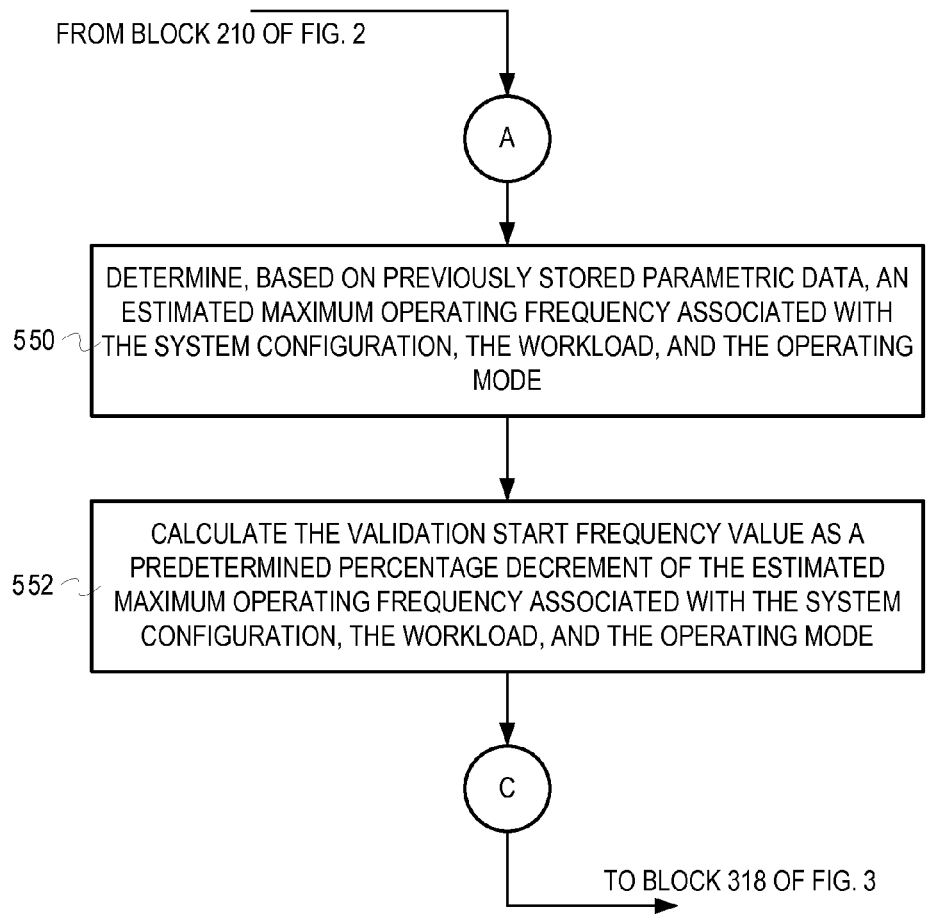

Referring now to FIG. 5, an estimated maximum operating frequency associated with the system configuration, the workload, and the operating mode is determined based, at least in part, on previously stored system parametric data (block 550). The flow 200 moves from block 210 in FIG. 2 to block 550 in FIG. 5 if it is determined that the system configuration was previously analyzed for one or more other processors. In one implementation, system parametric data associated with one or more processors that were validated on a system with the same system configuration, that were configured in the same operating mode, and that executed the same workload as the processor under test can be identified. For example, a workload identifier, an operating mode identifier, and a system configuration identifier associated with the processor under test can be determined. The system parametric data store 108 can be queried to identify data entries associated with the same workload identifier, operating mode identifier, and/or system configuration identifier. The corresponding system parametric data determined from the identified data entries can be employed to determine the estimated system maximum operating frequency associated with the processor. For example, the estimated system maximum operating frequency associated with the processor may be calculated as an average of the system maximum operating frequency associated with the identified previously validated processors. The flow continues at block 552.

The validation start frequency is calculated as a predetermined percentage decrement of the estimated maximum operating frequency associated with the system configuration, the workload, and the operating mode (block 552). The flow then continues at block 318 in FIG. 3, where the processor is then prompted to execute the workload and the operating frequency associated with the processor is increased from the validation start frequency until system failure occurs or the target guard band frequency is achieved, as described above in blocks 318-336.

It should be understood that FIGS. 1-5 are examples meant to aid in understanding embodiments and should not be used to limit embodiments or limit scope of the claims. Embodiments may perform additional operations, fewer operations, operations in a different order, operations in parallel, and some operations differently. For example, in response to determining to validate the guard bands associated with the processor in accordance with another operating mode (as described in block 334 of FIG. 3), flow 200 moves from block 334 in FIG. 3 to block 206 in FIG. 2, where the next operating mode is identified and subsequent operations are executed in accordance with the next operating mode. However, embodiments are not so limited. In other embodiments, in response to determining to validate the guard bands associated with the processor in accordance with another operating mode, the flow 200 may move from block 334 of FIG. 3 to block 216 of FIG. 2 where a new validation start frequency may be determined based on the next operating mode (e.g., based on system parametric data associated with previously validated processors configured in the next operating mode, based on previously generated system parametric data associated with the processor under test, etc.). Operations for validating the processor in the system test environment can be executed beginning at the new validation start frequency.

In some embodiments, operations for validating the frequency guard bands of a processor for an operating mode, a workload, and a system configuration can be halted if the target guard band frequency is achieved without system failure (as described above in blocks 320 and 332). In this embodiment, the operations for validating the frequency guard bands can be employed to identify guard band compatibility (e.g., whether the frequency guard bands determined in the system test environment match the frequency guard bands determined in the standalone test environment). However, in other embodiments, operations for validating the frequency guard bands may be executed until system failure is detected and the system maximum operating frequency is determined. In this embodiment, operations for validating the frequency guard bands can be employed to determine the maximum frequency at which the processor can operate in the system test environment.

In some embodiments (as described in blocks 320-324 of FIG. 3), the operating frequency of the processor may be incremented (and the processor may execute the workload) until the operating frequency is greater than or equal to the target guard band frequency. When the operating frequency equals or exceeds the target guard band frequency, execution of the workload may be paused, the system parametric data may be recorded, and the processor may be configured in the next operating mode (or the guard band validation procedure may be initiated for another processor). In other embodiments, however, the operating frequency of the processor may be incremented (and the workload may be executed by the processor) until system failure. In this embodiment, (as described in blocks 326-330) after system failure is detected, the maximum operating frequency associated with the processor and the system parametric data at the system maximum operating frequency may be recorded. System to tester correlation may be validated and the guard band validation procedure may be initiated for the next operating mode, the next workload, or another processor.

Although not described with reference to FIGS. 1-5, it is noted that voltage guard bands associated with the processor can also be validated. For example, referring to FIG. 4, the minimum operating voltage associated with the processor in the system test environment ("system minimum operating voltage") is determined at block 444. The minimum operating voltage associated with the processor in the standalone test environment ("tester minimum operating voltage") can then be determined, e.g., from the tester parametric data store 110. After the system minimum operating voltage is determined, the system minimum operating voltage can be adjusted (e.g., based on the operating frequency and temperature at which the tester minimum operating voltage was determined) to calculate the system adjusted minimum operating voltage. The minimum operating voltage associated with the processor in the system test environment can also be adjusted to compensate for resistive drops from the voltage source output to the processor cores. The system adjusted minimum operating voltage can then be compared and correlated against the tester minimum operating voltage.

Furthermore, in some implementations, the temperature of the system may also be varied in accordance with the temperature of the standalone test environment (e.g., when the tester parametric data was determined) to achieve a better correlation between the system parametric data and the tester parametric data and to improve the accuracy of frequency guard banding. In some implementations, the difference between the temperature in the system test environment vis-à-vis the temperature in the standalone test environment can also be taken into consideration when determining the validation start frequency. Lastly, it is noted that although embodiments describe validating correlation between the system parametric data and the parametric data associated with the processor when tested in a standalone environment, embodiments are not so limited. In other embodiments, the system parametric data may be correlated against parametric data associated with the processor in the wafer-testing environment, or other suitable testing environment.

As will be appreciated by one skilled in the art, aspects of the present inventive subject matter may be embodied as a system, method or computer program product. Accordingly, aspects of the present inventive subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present inventive subject matter may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present inventive subject matter may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present inventive subject matter are described with reference to flowchart illustrations and/or block diagrams of methods, apparatus (systems) and computer program products according to embodiments of the inventive subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 6:
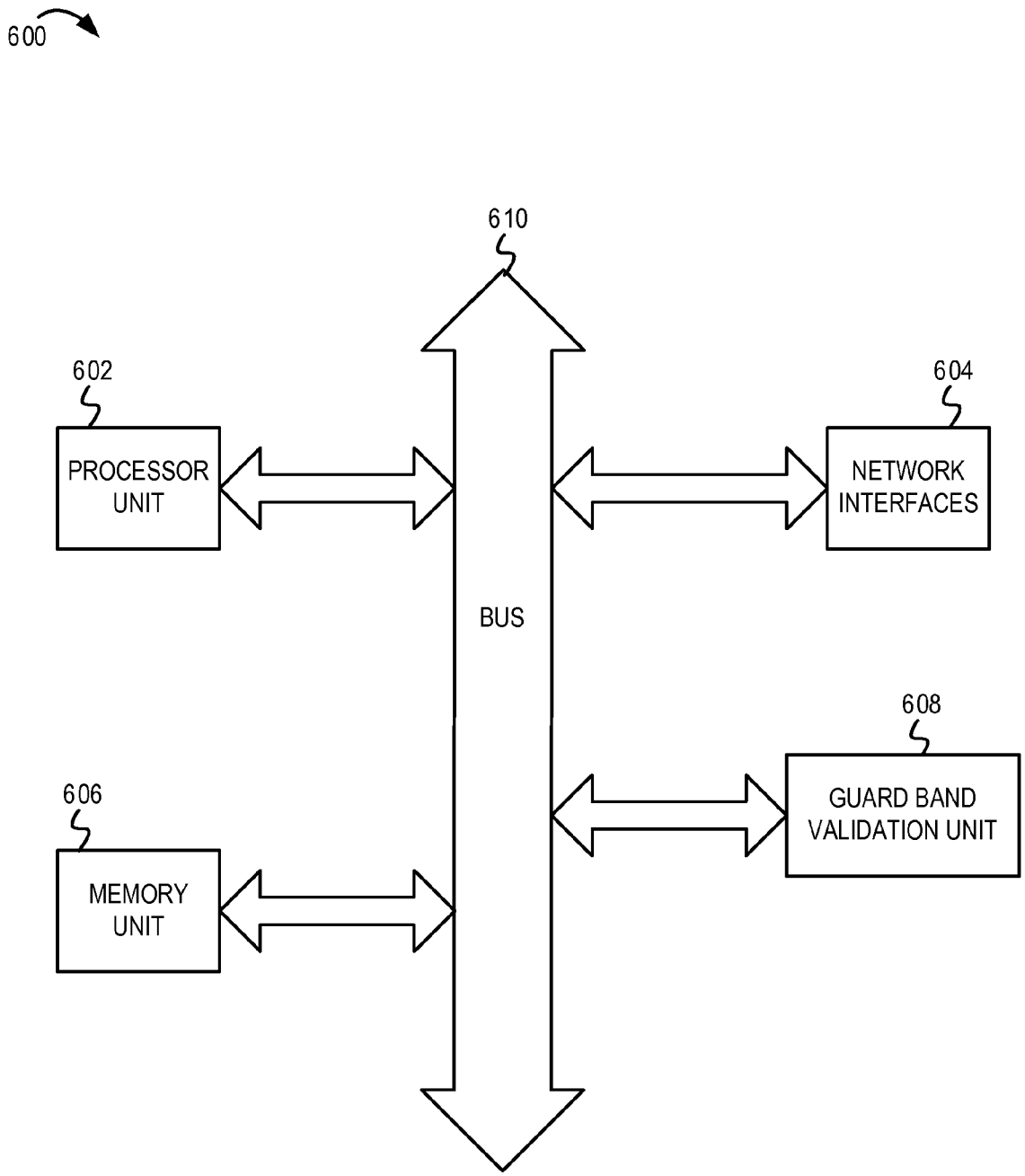
FIG. 6 is a block diagram of one embodiment of an electronic system including a mechanism for validating frequency guard bands associated with a processor in a system test environment.

FIG. 6 is a block diagram of one embodiment of an electronic system 600 including a mechanism for validating frequency guard bands associated with a processor in a system test environment. The electronic system 600 includes a processor unit 602 (possibly including multiple processors, multiple cores, multiple nodes, and/or implementing multithreading, etc.). The electronic system 600 includes a memory unit 606. The memory unit 606 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The electronic system 600 also includes a bus 610 (e.g., PCI, ISA, PCI-Express, HyperTransport®, InfiniBand®, NuBus, AHB, AXI, etc.), and network interfaces 604 that include at least one of a wireless network interface (e.g., a WLAN interface, a Bluetooth® interface, a WiMAX interface, a ZigBee® interface, a Wireless USB interface, etc.) and a wired network interface (e.g., an Ethernet interface, an ATM interface, a Frame Relay interface, SONET interface, etc.). The processor unit 602, the memory unit 606, and the network interfaces 604 are coupled to the bus 610.

In some implementations, the electronic system 600 may be a circuit board, a system on a chip, an interconnection of one or more integrated circuits, or other suitable electronic systems. For example, if the processor unit 602 is to be subsequently deployed in a server, the electronic system 600 may comprise one or more other server components to simulate operating conditions that the processor may encounter when deployed in the server. The electronic system 600 also includes a guard band validation unit 608. The guard band validation unit 608 can implement functionality to validate the guard band frequency and/or other operating parameters (e.g., a maximum operating frequency) associated with the processor unit 602, when the processor unit 602 is connected in the system test environment. As described above in FIGS. 1-5, the guard band validation unit 608 can determine a validation start frequency (that is greater than the nominal operating frequency) based, at least in part, on system parametric data and tester parametric data. The guard band validation unit 608 can execute frequency guard band operations beginning at the validation start frequency to validate the guard band frequency determined in the system test environment with the guard band frequency determined in the standalone test environment. In some implementations, the guard band validation unit 608 can also, beginning at the validation start frequency, validate the maximum operating frequency determined in the system test environment with the maximum operating frequency determined in the standalone test environment. Although FIG. 6 depicts the guard band validation unit 608 being implemented as part of the electronic system 600, it is noted that in other implementations, the guard band validation unit 608 can be embodied on a distinct circuit board (or integrated circuit) and may be externally coupled with the processor unit 602 and/or the electronic system 600. Any one of these functionalities may be partially (or entirely) implemented in hardware and/or on the processor unit 602. For example, the functionality may be implemented with an application specific integrated circuit, in logic implemented in the processor unit 602, in a co-processor on a peripheral device or card, etc. Further, realizations may include fewer or additional components not illustrated in FIG. 6 (e.g., video cards, audio cards, additional network interfaces, peripheral devices, etc.). Although illustrated as being coupled to the bus 610, the memory unit 606 may be coupled to the processor unit 602.

While the embodiments are described with reference to various implementations and exploitations, it will be understood that these embodiments are illustrative and that the scope of the inventive subject matter is not limited to them. In general, techniques for validating frequency guard bands associated with processors as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the example configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A method comprising:
   determining whether validation of at least one of a plurality of previously validated processors on a first system produced data usable for computing a validation start frequency of an unvalidated processor on a second system, wherein the validation start frequency is between a nominal operating frequency and a system maximum operating frequency of the unvalidated processor;
   if validation of at least one of the plurality of previously validated processors on the first system produced data usable for validating the unvalidated processor on the second system then,
      identifying a subset of the plurality of previously validated processors that were validated on the first system;
      computing, by a guard band validation unit, the validation start frequency associated with the unvalidated processor based, at least in part, on system parametric data associated with the subset of the plurality of previously validated processors that were validated on the first system, wherein the validation start frequency indicates an operating frequency associated with the unvalidated processor at which to initiate validation of a guard band frequency for the unvalidated processor, wherein the system parametric data associated with the subset of the plurality of previously validated processors comprises operating parameters recorded during validation of each of the subset of the plurality of previously validated processors when the previously validated processor is coupled with the first system;

if validation of none of the plurality of previously validated processors on the first system produced data usable for validating the unvalidated processor on the second system then, computing, by the guard band validation unit, the validation start frequency associated with the unvalidated processor based, at least in part, on tester parametric data associated with the unvalidated processor, wherein the tester parametric data associated with the unvalidated processor comprises nominal operating parameters associated with the unvalidated processor when the unvalidated processor is not coupled with the second system; and initiating validation of the guard band frequency for the unvalidated processor at the validation start frequency.

2. The method of claim 1, wherein the system parametric data associated with the unvalidated processor comprises at least one of an operating frequency associated with the unvalidated processor and a corresponding operating voltage, an operating current, an operating temperature, and a loadline resistance associated with the unvalidated processor at the operating frequency, and wherein the tester parametric data associated with the unvalidated processor comprises at least one of a nominal operating frequency, a nominal operating voltage, a nominal operating current, a nominal operating temperature, a tester maximum operating frequency that indicates a highest frequency at which the unvalidated processor operates when the unvalidated processor is not coupled with the second system, and a target guard band frequency associated with the unvalidated processor that indicates an upper limit on a guard band associated with the unvalidated processor when the unvalidated processor is not coupled with the second system.

3. The method of claim 1, wherein said determining whether validation of at least one of the plurality of previously validated processors on the first system produced data usable for computing a validation start frequency of an unvalidated processor on the second system comprises:

determining, at least one of a workload and an operating mode in accordance with which to validate the unvalidated processor on the second system; and determining whether at least one of the plurality of previously validated processors was validated on the first system in accordance with the at least one of the workload and the operating mode.

4. The method of claim 1, wherein said computing, by the guard band validation unit, the validation start frequency associated with the unvalidated processor based, at least in part, on the system parametric data associated with the subset of the plurality of previously validated processors comprises:

determining a maximum operating frequency associated with each of the subset of the plurality of previously validated processors based on the system parametric data associated with the subset of the processors, wherein the maximum operating frequency associated with each of the subset of the plurality of previously validated processors indicates a maximum frequency at which the previously validated processor operates without failure of the first system on which the previously validated processor was validated; and determining the validation start frequency associated with the unvalidated processor based, at least in part, on the maximum operating frequency associated with each of the subset of the plurality of previously validated processors.

5. The method of claim 1, wherein said computing, by the guard band validation unit, the validation start frequency associated with the unvalidated processor based, at least in part, on tester parametric data associated with the unvalidated processor comprises:

setting an operating frequency associated with the unvalidated processor at a predetermined base operating frequency;

causing the unvalidated processor to initiate execution of a workload;

beginning at a base operating voltage that corresponds to the base operating frequency, progressively reducing the operating voltage associated with the unvalidated processor until failure of the second system comprising the unvalidated processor is detected;

determining a minimum operating voltage associated with the unvalidated processor as the lowest voltage at which the unvalidated processor operates without failure of the second system comprising the unvalidated processor; and calculating the validation start frequency associated with the unvalidated processor based on at least one of a difference between the base operating voltage and the minimum operating voltage, the tester parametric data associated with the unvalidated processor, and the system parametric data associated with at least one of the plurality of previously validated processors.

6. The method of claim 1, wherein said computing, by the guard band validation unit, the validation start frequency associated with the unvalidated processor based, at least in part, on tester parametric data associated with the unvalidated processor comprises:

causing the unvalidated processor to initiate execution of a workload at a predetermined base operating frequency;

determining system parametric data associated with the unvalidated processor at the base operating frequency;

correlating the system parametric associated with the unvalidated processor at the base operating frequency with at least one of the tester parametric data associated with the unvalidated processor and the system parametric data associated with at least one of the plurality of previously validated processors to determine the validation start frequency associated with the unvalidated processor.

7. The method of claim 1, further comprising:

beginning at the validation start frequency, causing the unvalidated processor to execute a workload to determine system parametric data associated with the unvalidated processor, wherein the system parametric data associated with the unvalidated processor comprises operating parameters associated with the unvalidated processor when the unvalidated processor is coupled with the second system; and correlating the system parametric data associated with the unvalidated processor against the tester parametric data associated with the unvalidated processor to validate the unvalidated processor on the second system.

8. The method of claim 7, wherein said correlating the system parametric data associated with the unvalidated processor against the tester parametric data associated with the unvalidated processor comprises:
- comparing the system parametric data associated with the unvalidated processor against the tester parametric data associated with the unvalidated processor;
- determining whether the system parametric data associated with the unvalidated processor is within a threshold value of the tester parametric data associated with the unvalidated processor;
- if the system parametric data associated with the unvalidated processor is within the threshold value of the tester parametric data associated with the unvalidated processor, determining that the unvalidated processor is validated on the second system; and
- if the system parametric data associated with the unvalidated processor is not within the threshold value of the tester parametric data associated with the unvalidated processor, determining that the unvalidated processor is not validated on the second system.

9. The method of claim 7, wherein said beginning at the validation start frequency, causing the unvalidated processor to execute the workload to determine the system parametric data associated with the unvalidated processor comprises:
- setting the operating frequency associated with the unvalidated processor to the validation start frequency;
- causing the unvalidated processor to initiate execution of the workload;
- at each iteration,
  - determining whether the operating frequency associated with the unvalidated processor is greater than or equal to a target guard band frequency associated with the processor, wherein the tester parametric data comprises the target guard band frequency and wherein the target guard band frequency indicates an upper limit on a guard band associated with the unvalidated processor when the unvalidated processor is not coupled with the second system;
  - if the operating frequency associated with the unvalidated processor is greater than or equal to the target guard band frequency associated with the unvalidated processor,
    - recording the system parametric data associated with the unvalidated processor at the target guard band frequency; and
    - determining that the guard band frequency for the unvalidated processor is validated on the second system;
  - if the operating frequency associated with the unvalidated processor is less than the target guard band frequency associated with the unvalidated processor, detecting whether failure of the second system with which the unvalidated processor is associated occurred;
  - if failure of the second system with which the unvalidated processor is associated is detected,
    - determining the system maximum operating frequency associated with the unvalidated processor as the highest frequency at which the unvalidated processor operates without failure of the second system with which the unvalidated processor is associated;
    - recording the system parametric data associated with the unvalidated processor at the system maximum operating frequency; and
  - if failure of the second system is not detected, incrementing the operating frequency associated with the unvalidated processor by a predetermined frequency factor.

10. The method of claim 8, wherein said correlating the system parametric data associated with the unvalidated processor against the tester parametric data associated with the unvalidated processor comprises:
- comparing the system maximum operating frequency associated with the unvalidated processor against a tester maximum operating frequency that indicates a highest frequency at which the unvalidated processor operates when the unvalidated processor is not coupled with the second system;
- determining whether the system maximum operating frequency is within a threshold value of the tester maximum operating frequency;
- if the system maximum operating frequency is within the threshold value of the tester maximum operating frequency, determining that the unvalidated processor is validated on the second system; and
- if the system maximum operating frequency is not within the threshold value of the tester maximum operating frequency, determining that the unvalidated processor is not validated on the second system.

11. The method of claim 7, wherein said beginning at the validation start frequency, causing the unvalidated processor to execute the workload to determine the system parametric data associated with the unvalidated processor comprises:
- setting the operating frequency associated with the unvalidated processor to the validation start frequency;
- causing the unvalidated processor to initiate execution of the workload;
- at each iteration,
  - detecting whether failure of the second system with which the unvalidated processor is associated occurred;
  - if failure of the second system with which the unvalidated processor is associated is detected,
    - determining the system maximum operating frequency associated with the unvalidated processor as the highest frequency at which the unvalidated processor operates without failure of the second system with which the unvalidated processor is associated;
    - recording the system parametric data associated with the unvalidated processor at the system maximum operating frequency; and
  - if failure of the second system is not detected, incrementing the operating frequency associated with the unvalidated processor by a predetermined frequency factor.

12. A method comprising:
- determining whether validation of at least one of a plurality of previously validated processors, associated with a workload and an operating mode, on a first system produced data usable for computing a an initial set point of an unvalidated processor on a second system in which the unvalidated processor is being tested in accordance with the workload and the operating mode, wherein the initial set point is between a nominal operating frequency and a system maximum operating frequency of the unvalidated processor;
- if validation of at least one of the plurality of previously validated processors, associated with the workload and the operating mode, on the first system produced data usable for computing a validation start frequency of an unvalidated processor on the second system in which the unvalidated processor is being tested in accordance with the workload and the operating mode, determining, by a guard band validation unit, the initial set point for validating the unvalidated processor on the second system in accordance with the workload and the operating mode based, at least in part, on system parametric data associated with at least one of the plurality of previously validated processors, wherein the system parametric data associated with the at least one of the plurality of previously validated processors comprises operating parameters recorded during validation of the at least one of the plurality of previously validated processors when the at least one of the plurality of previously validated processors is coupled with the first system;

if validation of none of the plurality of previously validated processors, associated with the workload and the operating mode, on the first system produced data usable for validating the unvalidated processor on the second system in which the unvalidated processor is being tested in accordance with the workload and the operating mode, determining, by a guard band validation unit, the initial set point for validating the unvalidated processor on the second system in accordance with the workload and the operating mode based, at least in part, on tester parametric data associated with the unvalidated processor, wherein the tester parametric data associated with the unvalidated processor comprises nominal operating parameters associated with the unvalidated processor when the unvalidated processor is not coupled with the second system; and causing the unvalidated processor, configured in the operating mode, to execute the workload at the initial set point to validate the unvalidated processor on the second system.

13. The method of claim 12, wherein said determining, by the guard band validation unit, the initial set point for validating the unvalidated processor on the second system in accordance with the workload and the operating mode comprises:

determining a threshold operating parameter value associated with the at least one of the plurality of previously validated processors based on the system parametric data associated with the at least one of the plurality of previously validated processors, wherein the threshold operating parameter value associated with the at least one of the plurality of previously validated processors indicates a last value at which the previously validated processor operates without failure of the first system on which the previously validated processor was tested; and determining the initial set point associated with the unvalidated processor based, at least in part, on the threshold operating parameter value associated with the at least one of the plurality of previously validated processors.

14. The method of claim 13, further comprising:

determining system parametric data associated with the unvalidated processor in response to said causing the unvalidated processor to execute the workload at the initial set point, wherein the system parametric data associated with the unvalidated processor comprises operating parameters associated with the unvalidated processor when the unvalidated processor is coupled with the second system;

comparing the system parametric data associated with the unvalidated processor against the tester parametric data associated with the unvalidated processor;

determining whether the system parametric data associated with the unvalidated processor is within a threshold value of the tester parametric data associated with the unvalidated processor;

if the system parametric data associated with the unvalidated processor is within the threshold value of the tester parametric data associated with the unvalidated processor, determining that the unvalidated processor is validated on the second system; and if the system parametric data associated with the unvalidated processor is not within the threshold value of the tester parametric data associated with the unvalidated processor, determining that the unvalidated processor is not validated on the second system.

15. The method of claim 14, wherein said determining system parametric data associated with the unvalidated processor comprises:

at each iteration beginning at the initial set point, detecting whether failure of the second system with which the unvalidated processor is associated occurred;

if failure of the second system with which the unvalidated processor is associated is detected, determining a threshold operating parameter value associated with the unvalidated processor as a last value at which the unvalidated processor operates without failure of the second system with which the unvalidated processor is associated;

recording the system parametric data associated with the unvalidated processor at the threshold operating parameter value; and if failure of the second system is not detected, updating the threshold operating parameters value associated with the unvalidated processor by a predetermined factor.

16. The method of claim 12, wherein the initial set point comprises a validation start frequency associated with the unvalidated processor that indicates an operating frequency associated with the unvalidated processor at which to initiate testing of the unvalidated processor on the second system.

17. A computer program product for validating frequency guard bands, the computer program product comprising:

a computer readable storage medium having computer usable program code embodied therewith, the computer usable program code configured to:

determine whether validation of at least one of a plurality of previously validated processors a first system produced data usable for computing a validation start frequency on a second system in which an unvalidated processor is being tested wherein the validation start frequency is between a nominal operating frequency and a system maximum operating frequency of the unvalidated processor;

if validation of at least one of the plurality of previously validated processors on the first system produced data usable for validating the unvalidated processor on the second system then, identify a subset of the plurality of previously validated processors that were validated on the first system;

compute a validation start frequency associated with the unvalidated processor based, at least in part, on system parametric data associated with the subset of the plurality of previously validated processors that were validated on the first system, wherein the validation start frequency indicates an operating frequency associated with the unvalidated processor at which to initiate testing validation of the guard band frequency for the unvalidated processor, wherein the system parametric data associated with the subset of the plurality of previously validated processors comprises operating parameters recorded during validation of each of the subset of the plurality of previously validated processors when the previously validated processor is coupled with the first system;

if validation of none of the plurality of previously validated processors on the first system produced data usable for validating the unvalidated processor on the second system then, compute the validation start frequency associated with the unvalidated processor based, at least in part, on tester parametric data associated with the unvalidated processor, wherein the tester parametric data associated with the unvalidated processor comprises nominal operating parameters associated with the unvalidated processor when the unvalidated processor is not coupled with the second system; and initiate validation of the guard band frequency for the unvalidated processor at the validation start frequency.

18. The computer program product of claim 17, wherein the computer usable program code is further configured to:

beginning at the validation start frequency, at each iteration, detect whether failure of the second system with which the unvalidated processor is associated occurred;

if failure of the second system is not detected, increment the operating frequency associated with the unvalidated processor by a predetermined frequency factor;

if failure of the second system with which the unvalidated processor is associated is detected, determine the system maximum operating frequency associated with the unvalidated processor as the highest frequency at which the unvalidated processor operates without failure of the second system with which the unvalidated processor is associated;

compare the system maximum operating frequency associated with the unvalidated processor against a tester maximum operating frequency that indicates a highest frequency at which the unvalidated processor operates when the unvalidated processor is not coupled with the second system;

determine whether the system maximum operating frequency is within a threshold value of the tester maximum operating frequency;

if the system maximum operating frequency is within the threshold value of the tester maximum operating frequency, determine that the unvalidated processor is validated on the second system; and if the system maximum operating frequency is not within the threshold value of the tester maximum operating frequency, determine that the unvalidated processor is not validated on the second system.

19. A system comprising:

an unvalidated processor;

a network interface coupled with the unvalidated processor; and a guard band validation unit coupled with the unvalidated processor and with the network interface, the guard band validation unit operable to:

determine whether validation of at least one of a plurality of previously validated processors on a second system produced data usable for computing a validation start frequency of an unvalidated processor on the system, wherein the validation start frequency is between a nominal operating frequency and a system maximum operating frequency of the unvalidated processor;

if validation of at least one of the plurality of previously validated processors on the second system produced data usable for computing the validation start frequency of the unvalidated processor on the system then, identify a subset of the plurality of previously validated processors that were validated on the second system;

compute a validation start frequency associated with the unvalidated processor based, at least in part, on system parametric data associated with the subset of the plurality of previously validated processors that were validated on the second system, wherein the validation start frequency indicates an operating frequency associated with the unvalidated processor at which to initiate validation of a guard band frequency for the unvalidated processor, wherein the system parametric data associated with the subset of the plurality of previously validated processors comprises operating parameters recorded during validation of each of the subset of the plurality of previously validated processors when the processor is coupled with the second system;

if validation of none of the plurality of previously validated processors on the second system produced data usable for validating the unvalidated processor on the system then, compute the validation start frequency associated with the unvalidated processor based, at least in part, on tester parametric data associated with the unvalidated processor, wherein the tester parametric data associated with the unvalidated processor comprises nominal operating parameters associated with the unvalidated processor when the unvalidated processor is not coupled with the system; and initiate validation of the guard band frequency for the unvalidated processor at the validation start frequency.

20. The system of claim 18, wherein the guard band validation unit is further operable to:

beginning at the validation start frequency, cause the unvalidated processor to execute a workload to determine system parametric data associated with the unvalidated processor, wherein the system parametric data associated with the unvalidated processor comprises operating parameters associated with the unvalidated processor when the unvalidated processor is coupled with the system;

compare the system parametric data associated with the unvalidated processor against the tester parametric data associated with the unvalidated processor;

determine whether the system parametric data associated with the unvalidated processor is within a threshold value of the tester parametric data associated with the unvalidated processor;

if the system parametric data associated with the unvalidated processor is within the threshold value of the tester parametric data associated with the unvalidated processor, determine that the unvalidated processor is validated on the system; and if the system parametric data associated with the unvalidated processor is not within the threshold value of the tester parametric data associated with the unvalidated processor, determine that the unvalidated processor is not validated on the system.

* * * * *